United States Patent
Park et al.

(10) Patent No.: US 9,972,726 B2
(45) Date of Patent: May 15, 2018

(54) PHOTOVOLTAIC APPARATUS

(71) Applicant: LG INNOTEK CO., LTD., Seoul (KR)

(72) Inventors: Kyung Eun Park, Seoul (KR); Seung Tae Kim, Seoul (KR); Hyun Woo Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 621 days.

(21) Appl. No.: 14/395,490

(22) PCT Filed: Apr. 25, 2013

(86) PCT No.: PCT/KR2013/003566
§ 371 (c)(1),
(2) Date: Oct. 19, 2014

(87) PCT Pub. No.: WO2013/162302
PCT Pub. Date: Oct. 31, 2013

(65) Prior Publication Data
US 2015/0129012 A1  May 14, 2015

(30) Foreign Application Priority Data
Apr. 26, 2012 (KR) .................. 10-2012-0043859

(51) Int. Cl.
*H01L 31/00* (2006.01)
*H01L 31/02* (2006.01)
(Continued)

(52) U.S. Cl.
CPC .......... *H01L 31/0201* (2013.01); *H02S 40/34* (2014.12); *H02S 40/36* (2014.12)

(58) Field of Classification Search
CPC ....... H01L 31/0201; H02S 40/34; H02S 40/36
(Continued)

(56) References Cited

U.S. PATENT DOCUMENTS

2006/0162772 A1* 7/2006 Presher, Jr. ............... H02J 7/35
136/251
2008/0283111 A1  11/2008 Higashikozono et al.
2012/0180843 A1* 7/2012 Park .................... H01L 31/0201
136/244

FOREIGN PATENT DOCUMENTS

CN        101057375 A    10/2007
JP        2000058896 A    2/2000
(Continued)

OTHER PUBLICATIONS

Search Report for International Application No. PCT/KR2013/003566.
(Continued)

*Primary Examiner* — Matthew T Martin
(74) *Attorney, Agent, or Firm* — LRK Patent Law Firm

(57) ABSTRACT

A photovoltaic apparatus includes a solar cell panel including a plurality of solar cells, a junction part connected to the solar cell panel, a first wiring extending from the junction part, a second wiring extending from the junction part, a third wiring extending from the junction part, and a fourth wiring extending from the junction part. The junction part includes a first terminal part connected to the solar cells, a second terminal part connected to the solar cells, and a by-pass diode connected to the first and second terminal parts. The first and second wirings are connected to the first terminal part, and the third and fourth wirings are connected to the second terminal part.

11 Claims, 3 Drawing Sheets

(51) Int. Cl.
*H02S 40/34* (2014.01)
*H02S 40/36* (2014.01)

(58) Field of Classification Search
USPC .......................................................... 136/244
See application file for complete search history.

(56) References Cited

FOREIGN PATENT DOCUMENTS

| | | |
|---|---|---|
| JP | 3572265 B2 | 9/2004 |
| JP | 2005-224036 A | 8/2005 |
| JP | 2006-173539 A | 6/2006 |
| JP | 4778116 B2 | 9/2011 |
| KR | 10-2011-0001823 A | 1/2011 |
| KR | 10-1039050 B1 | 6/2011 |
| WO | WO 2010047345 A1 * 4/2010 ......... H01R 13/6273 |
| WO | WO 2011040779 A2 * 4/2011 ......... H01L 31/0201 |

OTHER PUBLICATIONS

SIPO Office Action for Chinese Application No. 201380022249.6 which corresponds to the above-referenced U.S. application.

* cited by examiner

[Fig. 1]
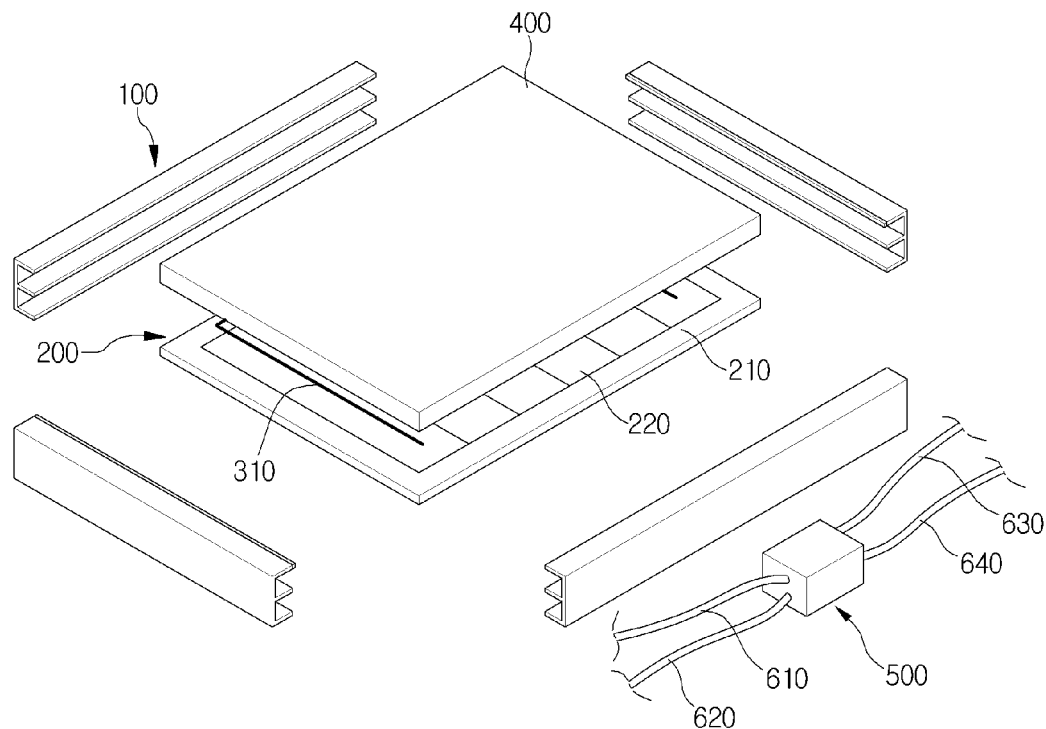
[Fig. 2]
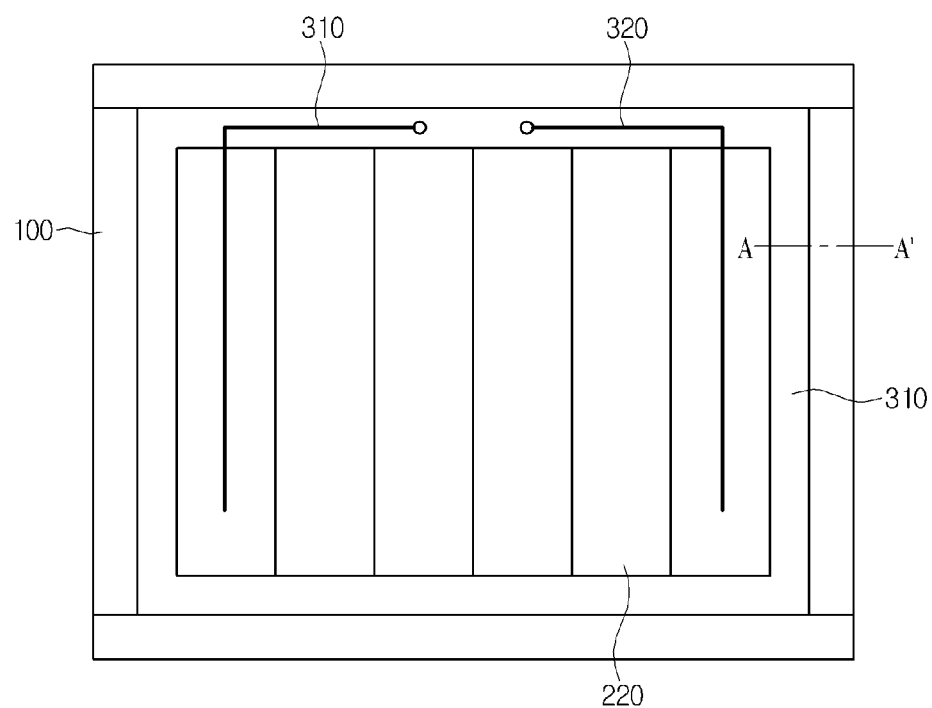

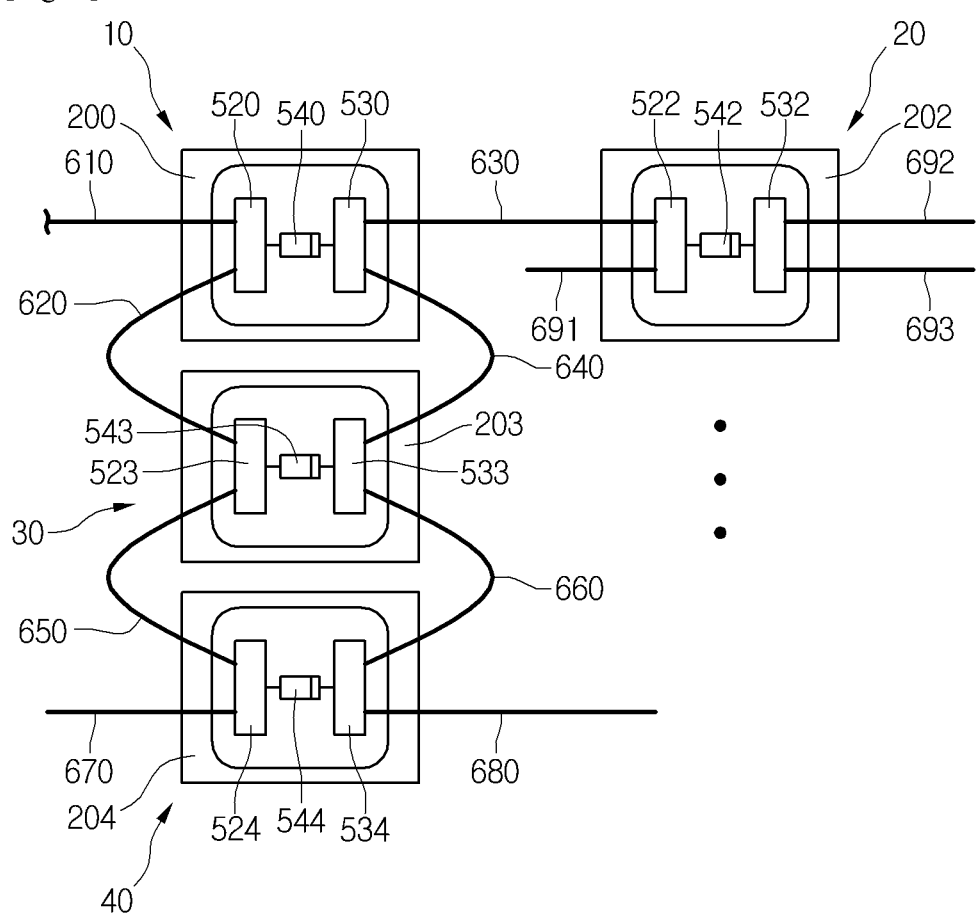
[Fig. 6]

PHOTOVOLTAIC APPARATUS

TECHNICAL FIELD

The embodiment relates to a photovoltaic apparatus.

BACKGROUND ART

Photovoltaic apparatuses to convert the sunlight into electrical energy include solar cells panels, diodes, and frames.

The solar cell panel has the shape of a plate. For example, the solar cell panel has the shape of a rectangular plate. The solar cell panel is provided inside the frame. Four lateral sides of the solar cell panel are provided inside the frame.

The solar cell panel receives the sunlight and converts the sunlight into the electrical energy. The solar cell panel includes a plurality of solar cells. In addition, the solar cell panel may further include a substrate, a film, or a protective glass to protect the solar cells.

In addition, the solar cell panel includes bus bars coupled to the solar cells. The bus bars extend from the top surface of the outermost solar cells so that the bus bars are connected to wirings, respectively.

The diode is connected to the solar cell panel in parallel. Current selectively flows through the diode. In other words, when the performance of the solar cell panel is deteriorated, current flows through the diode. Therefore, the photovoltaic apparatus according to the embodiment can be prevented from being shorted. In addition, the photovoltaic apparatus may further include wirings connected to the diode and the solar cell panel. The wirings are connected to solar cell panels adjacent to each other.

The frame receives the solar cell panel. The frame includes metal. The frame is provided at the lateral side of the solar cell panel. The frame receives the lateral sides of the solar cell panel. In addition, the frame may include a plurality of sub-frames. In this case, the sub-frames may be connected to each other.

The photovoltaic apparatus is installed in the outdoor field to convert the sunlight into the electrical energy.

The technology related to the photovoltaic apparatus is disclosed in Korean Unexamined Patent Publication No. 10-2009-0059529.

DISCLOSURE OF INVENTION

Technical Problem

The embodiment provides a photovoltaic apparatus that can be easily installed.

Solution to Problem

According to the embodiment, there is provided a photovoltaic apparatus including a solar cell panel including a plurality of solar cells, a junction part connected to the solar cell panel, a first wiring extending from the junction part, a second wiring extending from the junction part, a third wiring extending from the junction part, and a fourth wiring extending from the junction part. The junction part includes a first terminal part connected to the solar cells, a second terminal part connected to the solar cells, and a by-pass diode connected to the first and second terminal parts. The first and second wirings are connected to the first terminal part, and the third and fourth wirings are connected to the second terminal part.

Advantageous Effects of Invention

As described above, according to the photovoltaic apparatus of the embodiment, at least two wirings can be connected to each of the first and second terminal parts. In addition, the by-pass diode is connected to the first and second terminal parts, and the first and second bus bars may be connected to the first and second terminal parts.

Accordingly, the photovoltaic apparatus according to the embodiment can be connected to another solar cell module in series and in parallel. In other words, the photovoltaic apparatus according to the embodiment may be connected to the first solar cell module through the third wiring in series, and may be connected to the second solar cell module through the second and fourth wirings in parallel.

As described above, the photovoltaic apparatus according to the embodiment can be easily connected to other solar cell modules in series and in parallel.

BRIEF DESCRIPTION OF DRAWINGS

FIG. 1 is an exploded perspective view showing a solar cell module according to the embodiment.

FIG. 2 is a plan view showing the solar cell module according to the embodiment.

FIG. 6 is a view showing the state that several solar cell modules are connected to each other.

MODE FOR THE INVENTION

Figure 3:
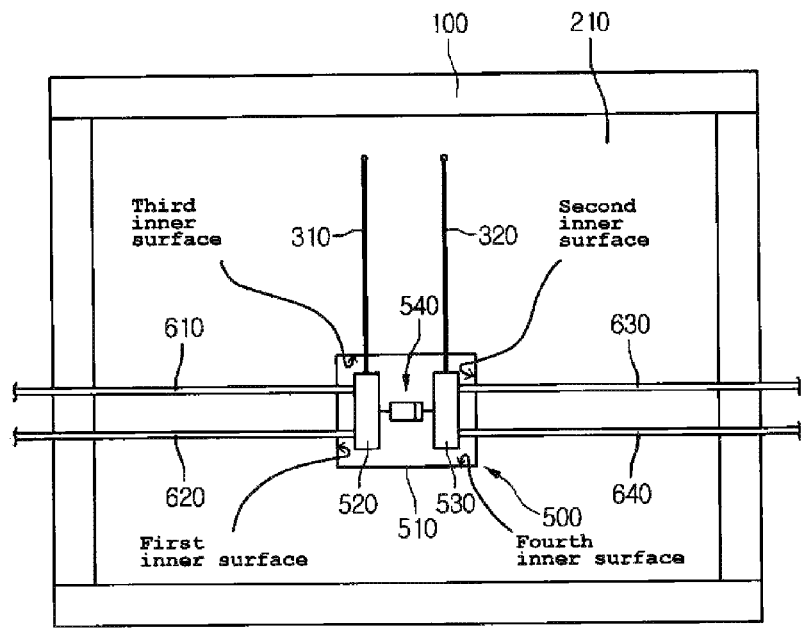
FIG. 3 is a bottom view showing the solar cell module according to the embodiment.

In the description of the embodiments, it will be understood that when a panel, bar, frame, substrate, groove, or film is referred to as being "on" or "under" another panel, bar, frame, substrate, groove, or film, it can be "directly" or "indirectly" on the other a panel, bar, frame, substrate, groove, or film, or one or more intervening layers may also be present. Such a position of each component has been described with reference to the drawings. The size of each component shown in the drawings may be exaggerated, omitted or schematically drawn for the purpose of convenience or clarity. In addition, the size of the component does not utterly reflect an actual size.

Figure 4:
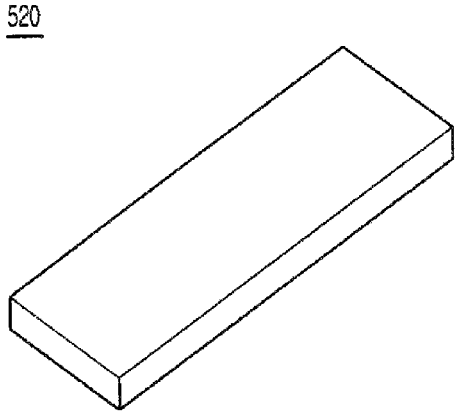
FIG. 4 is a perspective view showing a terminal part according to one embodiment.
Figure 5:
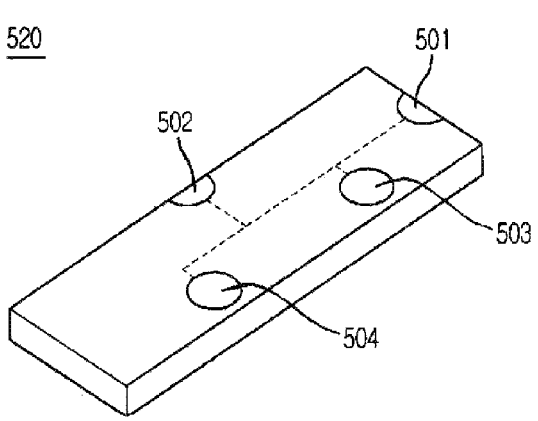
FIG. 5 is a perspective view showing a terminal part according to another embodiment.

FIG. 1 is an exploded perspective view showing a solar cell module according to the embodiment, FIG. 2 is a plan view showing the solar cell module according to the embodiment, and FIG. 3 is a bottom view showing the solar cell module according to the embodiment. FIG. 4 is a perspective view showing a terminal according to one embodiment, FIG. 5 is a perspective view showing a terminal according to another embodiment, and FIG. 6 is a view showing the state that several solar cell modules are connected to each other.

Referring to FIGS. 1 to 6, the solar cell module according to the embodiment includes a frame 100, a solar cell panel 200, a protective substrate 400, a junction part 500, a first wiring 610, a second wiring 620, a third wiring 630, and a fourth wiring 640.

The frame 100 receives the solar cell panel 200. In detail, the frame 100 receives the lateral side of the solar cell panel 200. In more detail, the frame 100 receives the solar cell panel 200 and the protective substrate 400.

In addition, the frame 100 surrounds the lateral side of the solar cell panel 200. For example, the frame 100 is disposed at four lateral sides of the solar cell panel 200. In more detail, the frame 100 may include four sub-frames disposed at the four lateral sides of the solar cell panel 200, respectively. The sub-frames are coupled with each other to receive the solar cell panel 200. The frame 100 may include metal such as aluminum (Al).

The solar cell panel 200 the shape of a plate. For example, the solar cell panel 200 may have the shape of a rectangular plate.

The solar cell panel 200 is provided inside the frame 100. In detail, an outer portion of the solar cell panel 200 is provided inside the frame 100. In other words, the four lateral sides of the solar cell panel 200 are provided inside the frame 100.

The solar cell panel 200 receives the sunlight and converts the sunlight into the electrical energy. The solar cell panel 200 includes a support substrate 210 and a plurality of solar cells 220.

The support substrate 210 has a plate shape, and supports the solar cells 220.

The support substrate 210 may be an insulator. The support substrate 210 may be a glass substrate, a plastic substrate, or a metal substrate. In detail, the support substrate 210 may be a soda lime glass substrate. The support substrate 210 may be transparent. The support substrate 210 may be rigid or flexible.

The solar cells 220 are disposed on the support substrate 210. In detail, the solar cells 220 are disposed on a top surface of the support substrate 210. In more detail, the solar cells 220 may be directly disposed on the top surface of the support substrate 210.

The solar cells 220 extend in one direction. The solar cells 220 extend in parallel to each other. The solar cells 220 are spaced apart from each other by a predetermined interval. In other words, the solar cells 220 may be provided in the form of a stripe.

The solar cells 230 may convert incident sunlight into electrical energy. The solar cells 220 may be connected to each other in parallel. In more detail, the solar cells 220 may be connected to each other in series.

For example, the solar cells 220 may include a CIGS solar cell, a silicon-based solar cell, a dye-sensitized solar cell, a group II-VI compound semiconductor solar cell, or a group III-V compound semiconductor solar cell.

A sealing member may be interposed between the solar cell panel 200 and the frame 100. The sealing member may include a material such as resin having elasticity. The sealing member prevents foreign matters from being infiltrated into the region between the solar cell panel 220 and the frame 100.

A buffer sheet may be interposed between the solar cell panel 200 and the protective substrate. The buffer sheet is provided on the solar cells 220. The buffer sheet is disposed on the support substrate 210 while covering the solar cells 220.

The buffer sheet is transparent and has elasticity. The buffer sheet may include ethylenevinylacetate (EVA) resin.

The buffer sheet is interposed between the support substrate 210 and the protective substrate 400. The buffer sheet may perform a mechanical buffer function and an optical buffer function between the support substrate 210 and the protective substrate 400.

The protective substrate 400 is disposed on the buffer sheet. The protective substrate 400 is provided in opposition to the support substrate 210. The protective substrate 400 protects the solar cells 220. The material used for the protective substrate 400 may include a tempered glass.

The protective substrate 400 is disposed on the solar cells 220. In addition, the protective substrate 400 is disposed inside the frame 100 similarly to the solar cell panel 200. The protective substrate 400 protects the solar cells 220 from the external physical shock and/or foreign matters. The protective substrate 400 is transparent.

First and second bus bars 310 and 320 may be connected to the solar cells 220. The first and second bus bars 310 and 320 are coupled with the solar cell panel 200. In detail, the first bus bar 310 is disposed on a top surface of one outermost solar cell 220, and the second bus bar 320 is disposed on a top surface of another outermost solar cell 210. The first and second bus bars 310 and 320 directly make contact with the top surfaces of the outermost solar cells 220 so that the first and second bus bars 310 and 320 are coupled to the solar cells 220.

In addition, the first and second bus bars 310 and 320 are disposed on a bottom surface of the solar cell panel 200. In more detail, the first and second bus bars 310 and 320 extend along the bottom surface of the solar cell panel 200 so that the first and second bus bars 310 and 320 are connected to the junction part 500.

The junction part 500 is disposed under the solar cell panel 200. The junction part 500 may be attached to the bottom surface of the solar cell panel 200. The junction part 500 may be electrically connected to the solar cells 220. In addition, the junction part 500 is connected to the first and second bus bars 310 and 320. In detail, the solar cells 220 are connected to the junction part 500 through the first and second bus bars 310 and 320.

As shown in FIG. 3, the junction part 500 includes a box part 510, a first terminal part 520, a second terminal part 530, and a by-pass diode 540.

The box part 510 receives the first and second terminal parts 520 and 530, and the by-pass diode 540. The box part 510 may include plastic. The box part 510 may receive the first and second terminal parts 520 and 530, and the by-pass diode 540.

The first terminal part 520 is disposed in the box part 510. The first terminal part 520 is connected to the by-pass diode 540. In addition, the first bus bar 310 is connected to the first terminal part 520. In addition, the first and second wirings 610 and 620 are connected to the first terminal part 520. In other words, the first terminal part 520 electrically connects the first wiring 610, the second wiring 620, the by-pass diode 540, and the first bus bar 310 to each other.

The second terminal part 530 is disposed in the box part 510. The second terminal part 530 is connected to the by-pass diode 540. In addition, the second bus bar 320 is connected to the second terminal part 530. In addition, the third and fourth wirings 630 and 640 are connected to the second terminal part 530. In other words, the second terminal parts 530 electrically connects the third wiring 630, the fourth wiring 640, the by-pass diode 540, and the second bus bar 320 to each other.

As shown in FIG. 4, the first terminal part 520 may have the shape of a plate. Similarly, the second terminal part 530 may have the shape of a plate. The first and second terminal parts 520 and 530 include a conductor such as metal. In more detail, the first and second terminal parts 520 and 530 may include a conductive plate.

Alternatively, as shown in FIG. 5, the first terminal part 520 may be a circuit board. The terminal part 520 may include first to fourth connection pads 501 to 504.

The first connection pad 501 is connected with the first bus bar 310. The second connection pad 502 is connected with the by-pass diode 540. The third connection pad 503 is connected with the first wiring 610. The fourth connection pad 504 is connected to the second wiring 620. In addition, the first to fourth connection pads 501 to 504 may be connected to each other through internal wirings.

Similarly, the second terminal part 530 may be circuit board having the same structure as that of the first terminal part 520.

The by-pass diode 540 is connected to the first and second terminal parts 520 and 530. The by-pass diode 540 electrically connects the first and second terminal parts 520 and 530 when the solar cell panel 200 is not operated. A first electrode (e.g., anode) of the by-pass diode 540 may be connected to the first terminal part 520. In addition, a second electrode (e.g., cathode) of the by-pass diode 540 may be connected to the second terminal part 530. On the contrary, the cathode of the by-pass diode 540 may be connected to the first terminal part 520, and the anode of the by-pass diode 540 may be connected to the second terminal part 530.

The first wiring 610 extends from the junction part 500. The first wiring 610 is connected to the first terminal part 520. The first wiring 610 may be connected to another solar cell module.

The second wiring 620 extends from the junction part 500. The second wiring 610 is connected to the first terminal part 520. The second wiring 620 may be connected to another solar cell module.

The third wiring 630 extends from the junction part 500. The third wiring 630 is connected to the second terminal part 530. The third wiring 630 may be connected to another solar cell module.

The fourth wiring 640 extends from the junction part 500. The fourth wiring 640 is connected to the second terminal part 530. The fourth wiring 640 may be connected to another solar cell module.

As shown in FIG. 6, first to fourth solar cell modules 10 to 40 may be connected to each other in series and/or in parallel. In addition, the first to fourth solar cell modules 10 to 40 may have the structure same as the structure of the solar cell module shown in FIGS. 1 to 5.

The first solar cell module 10, the third solar cell module 30, and the fourth solar cell module 40 are connected to each other in parallel. The first and second solar cell modules 10 and 20 are connected to each other in series.

The first solar cell module 10 includes the first solar cell panel 200, the first terminal part 520, the first by-pass diode 540, and the second terminal part 530.

The second solar cell module 20 includes a second solar cell panel 202, a third terminal part 522, the second by-pass diode 540, and a fourth terminal part 532.

The third solar cell module 30 includes a third solar cell panel 203, a fifth terminal part 523, the third by-pass diode 540, and a sixth terminal part 533.

The fourth solar cell module 40 includes a fourth solar cell panel 204, a fifth terminal part 524, the fourth by-pass diode 540, and an eighth terminal part 534.

The second and third terminal parts 530 and 522 are connected to each other by the third wiring 630. Accordingly, the first and second solar cell modules 10 and 20 are connected to each other in series.

The first and fifth terminal parts 520 and 523 are connected to each other by the second wiring 620. In addition, the second and sixth terminal parts 530 and 533 may be connected to each other by the fourth wiring 640. Accordingly, the first and third solar cell modules 10 and 30 may be connected to each other in parallel.

In addition, the fifth and seventh terminal parts 523 and 524 are connected to each other by the fifth wiring 650. In addition, the sixth and eighth terminal parts 533 and 534 may be connected to each other by the sixth wiring 660. Accordingly, the third and fourth solar cell modules 30 and 40 may be connected to each other in parallel. Accordingly, the first, third, and fourth solar cell modules 10, 30, and 40 may be connected to each other in parallel.

In addition, the second solar cell module 20 may be connected to other solar cell modules in series and/or in parallel through other wirings 691, 692, and 693.

Further, the fourth solar cell module 40 may be connected to other solar cell modules in series through other wirings 670 and 680

As described above, the solar cell modules according to the embodiment may be variously connected to each other in series and/or in parallel by using two terminal parts and four wirings. In other words, the solar cell modules according to the embodiment may be easily connected to each other.

In addition, the solar cell modules according to the present embodiment constitute a photovoltaic apparatus that receives the sunlight to generate electrical energy. According to the solar cell module of the present embodiment, one solar cell module may constitute the photovoltaic apparatus, or several solar cell modules may be connected to each other to constitute one photovoltaic apparatus.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic are described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A photovoltaic apparatus comprising:
a solar cell panel including a plurality of solar cells;
a junction part connected to the solar cell panel;
a first wiring extending from the junction part;
a second wiring extending from the junction part;
a third wiring extending from the junction part; and
a fourth wiring extending from the junction part,
wherein the junction part comprises:
a box part;
a first terminal part connected to the solar cells;
a second terminal part connected to the solar cells; and
a by-pass diode connected to the first, and second terminal parts, wherein the first and second wirings are connected to the first terminal part, and the third and fourth wirings are connected to the second terminal part, wherein the box part is formed of a first inner surface, a second inner surface, a third inner surface and a fourth inner surface to surround the first terminal part and the second terminal part, wherein the by-pass diode is disposed between the first terminal part and the second terminal part, wherein the first wiring and the second wiring extend from the first terminal part toward the first inner surface, wherein the third wiring and the fourth wiring extend from the second terminal part toward the second inner surface, wherein the first terminal part comprises a first circuit board, and the second terminal part comprises a second circuit board, wherein the first circuit board includes a plurality of connection pads which are electrically connected to each other by inner wiring of the first circuit board, wherein the plurality of connection pads of the first circuit board comprise;

a first connection pad connected to a first bus bar connected to one of the solar cells;

a second connection pad connected to the by-pass diode;

a third connection pad connected to the first wiring; and a fourth connection pad connected to the second wiring, wherein the second circuit board includes a plurality of connection pads which are electrically connected to each other by inner wiring of the second circuit board, wherein the plurality of connection pads of the second circuit board comprise a first connection pad connected to a second bus bar connected to another of the solar cells;

a second connection pad connected to the by-pass diode;

a third connection pad connected to the third wiring; and a fourth connection pad connected to the fourth wiring, and wherein the by-pass diode has a first electrode connected to the second connection pad of the first circuit board, and a second electrode connected to the second connection pad of the second circuit board.

2. The photovoltaic apparatus of claim 1, wherein the first bus bar is connected to the first terminal part, and the second bus bar is connected to the second terminal part.

3. The photovoltaic apparatus of claim 1, wherein each of the first and second terminal parts has a shape of a plate.

4. The photovoltaic apparatus of claim 2, wherein the first terminal part electrically connects the first wiring, the second wiring, the by-pass diode, and the first bus-bar to each other.

5. The photovoltaic apparatus of claim 2, wherein the second terminal part electrically connects the third wiring, the fourth wiring, the by-pass diode, and the second bus-bar to each other.

6. The photovoltaic apparatus of claim 1, wherein each of the first and second terminal parts includes a conductive plate.

7. The photovoltaic apparatus of claim 1, wherein the first terminal part is closer to the first inner surface than to the second inner surface.

8. The photovoltaic apparatus of claim 1, wherein the second terminal part is closer to the second inner surface than to the first inner surface.

9. The photovoltaic apparatus of claim 2, wherein each of the first terminal part and the second terminal part has a first length in a length direction of the first wiring, and a second length in a direction perpendicular to the length direction of the first wiring, and wherein the second length is longer than the first length.

10. The photovoltaic apparatus of claim 9, wherein the first bus bar extends from the one of the solar cells to the first terminal part.

11. The photovoltaic apparatus of claim 10, wherein the second bus bar extends from the other of the solar cells to the second terminal part.

* * * * *